(12) United States Patent
Safe et al.

(10) Patent No.: US 10,956,640 B1
(45) Date of Patent: Mar. 23, 2021

(54) SYSTEM, METHOD, AND COMPUTER PROGRAM PRODUCT FOR DETERMINING SUITABILITY FOR FORMAL VERIFICATION

(71) Applicant: Cadence Design Systems, Inc., San Jose, CA (US)

(72) Inventors: Georgia Penido Safe, Minas Gerais (BR); Mirlaine Aparecida Crepalde, Minas Gerais (BR); Yumi Monma, Minas Gerais (BR); Felipe Althoff, San Jose, CA (US); Fernanda Augusta Braga, Castro Valley, CA (US); Lucas Martins Chaves, Minas Gerais (BR); Pedro Bruno Neri Silva, Minas Gerais (BR); Mariana Ferreira Marques, Minas Gerais (BR); Vincent Gregory Reynolds, Berkshire (GB)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/507,574

(22) Filed: Jul. 10, 2019

(51) Int. Cl.
*G06F 17/50* (2006.01)
*G06F 30/3323* (2020.01)
*G06K 9/62* (2006.01)
*G06N 20/00* (2019.01)

(52) U.S. Cl.
CPC ....... *G06F 30/3323* (2020.01); *G06K 9/6267* (2013.01); *G06N 20/00* (2019.01)

(58) Field of Classification Search
CPC ...... G06F 30/3323; G06F 30/27; G06F 30/20; G06N 20/00; G06K 9/6267
See application file for complete search history.

(56) References Cited

U.S. PATENT DOCUMENTS

| 10,289,798 | B1* | 5/2019 | Nunes Barcelos | G06F 30/3323 |
| 2013/0019216 | A1* | 1/2013 | Vasudevan | G06F 30/3323 716/106 |
| 2016/0155069 | A1* | 6/2016 | Hoover | G06N 20/20 706/12 |
| 2018/0253512 | A1* | 9/2018 | Green | G06F 30/3323 |
| 2020/0019652 | A1* | 1/2020 | Qian | G06F 30/327 |

* cited by examiner

*Primary Examiner* — Nghia M Doan
(74) *Attorney, Agent, or Firm* — Mark H. Whittenberger, Esq.; Holland & Knight LLP (57) ABSTRACT

The present disclosure relates to a method for electronic design verification. Embodiments may include receiving, using a processor, an electronic design and providing at least a portion of the electronic design to a machine learning engine. Embodiments may further include automatically determining, based upon, at least in part, an output of the machine learning engine whether or not the at least a portion of the electronic design is amenable to formal verification.

15 Claims, 10 Drawing Sheets

SYSTEM, METHOD, AND COMPUTER PROGRAM PRODUCT FOR DETERMINING SUITABILITY FOR FORMAL VERIFICATION

FIELD OF THE INVENTION

The present disclosure relates to electronic design verification, and more specifically, to a method for determining suitability for formal verification.

DISCUSSION OF THE RELATED ART

In electronic designs, formal verification relies upon a system of constraints to communicate the legal state space to the proof engines. Formal verification offers great advantages over other methods for functional verification. Due to formal verification's exhaustive nature, without requiring a bulky testbench, valuable bugs may be found faster than in other approaches. These proven results also bring a level of confidence that cannot be matched by other methods. In other words, these proven results for a given assertion mean it is guaranteed to be impossible to ever create stimulus (under the current design and environment constraints set) that will violate the assertion. In contrast, in simulation for example, the assertion pass result indicates that none of the simulation tests caused the assert to fail, which does not necessarily mean that all possible scenarios have been exercised.

Currently, engineers evaluate electronic designs using different criteria to determine if it is amenable to formal verification. These criteria are often provided as a diagram wherein each aspect of the design is graded. The grades from the different aspects are assessed together to determine if the design is formal amenable or not. Using this diagram, all grading and assessment is subjective, thus the current implementation works more as a mindset framework than as an actual tool. As such, the classification of the design as amenable or not depends on the experience of the formal engineer and their interpretation of the criteria. This subjective approach often leads to mis-classification, which is always a problem. If a design is classified as amenable to formal but in reality is not, the engineer will waste time building the formal environment only to find out it can't be used to verify with confidence. This can lead to break of trust in the formal tool. On the other hand if the design is classified as not amenable to formal when it is, it leads to a lost opportunity to apply formal verification, thus a higher potential for bug escape.

SUMMARY OF DISCLOSURE

In one or more embodiments of the present disclosure, a computer-implemented method for electronic design verification. The method may include receiving, using a processor, an electronic design and providing at least a portion of the electronic design to a machine learning engine. The method may further include automatically determining, based upon, at least in part, an output of the machine learning engine whether or not the at least a portion is amenable to formal verification.

One or more of the following features may be included. In some embodiments, determining may include analyzing a number of configurations and a complexity of configurations. Determining may include analyzing a level of analysis required for convergence of one or more formal properties associated with the electronic design. Analyzing a level of analysis required may include analyzing design structures, design size, design complexity, and design controllability. Analyzing a level of analysis required may include determining a proof time required for convergence of the one or more formal properties. The method may further include labeling the at least one portion as being amenable to formal verification. The method may also include collecting one or more design features from the at least one portion. The method may further include adding the one or more design features to the machine learning engine. The one or more design features may be collected using structural and observability analysis. The machine learning engine may utilize a classification algorithm.

In one or more embodiments of the present disclosure a computer-readable storage medium having stored thereon instructions, which when executed by a processor result in one or more operations is provided. Operations may include receiving, using a processor, an electronic design and providing at least a portion of the electronic design to a machine learning engine, wherein the machine learning engine utilizes a Bernoulli Naïve Bayes classification algorithm. Operations may further include automatically determining, based upon, at least in part, an output of the machine learning engine whether or not the at least a portion is amenable to formal verification.

One or more of the following features may be included. In some embodiments, determining may include analyzing a number of configurations and a complexity of configurations. Determining may include analyzing a level of analysis required for convergence of one or more formal properties associated with the electronic design. Analyzing a level of analysis required may include analyzing design structures, design size, design complexity, and design controllability. Analyzing a level of analysis required may include determining a proof time required for convergence of the one or more formal properties. The method may further include labeling the at least one portion as being amenable to formal verification. The method may also include collecting one or more design features from the at least one portion. The method may further include adding the one or more design features to the machine learning engine. The one or more design features may be collected using structural and observability analysis.

In one or more embodiments of the present disclosure, a system for electronic design verification is provided. The system may include one or more processors configured to receive an electronic design and to provide at least a portion of the electronic design to a machine learning engine. The at least one processor may be further configured to automatically determine, based upon, at least in part, an output of the machine learning engine whether or not the at least a portion is amenable to formal verification, wherein determining includes analyzing a number of configurations, a complexity of configurations, and a level of analysis required for convergence of one or more formal properties associated with the electronic design.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Figure 1:
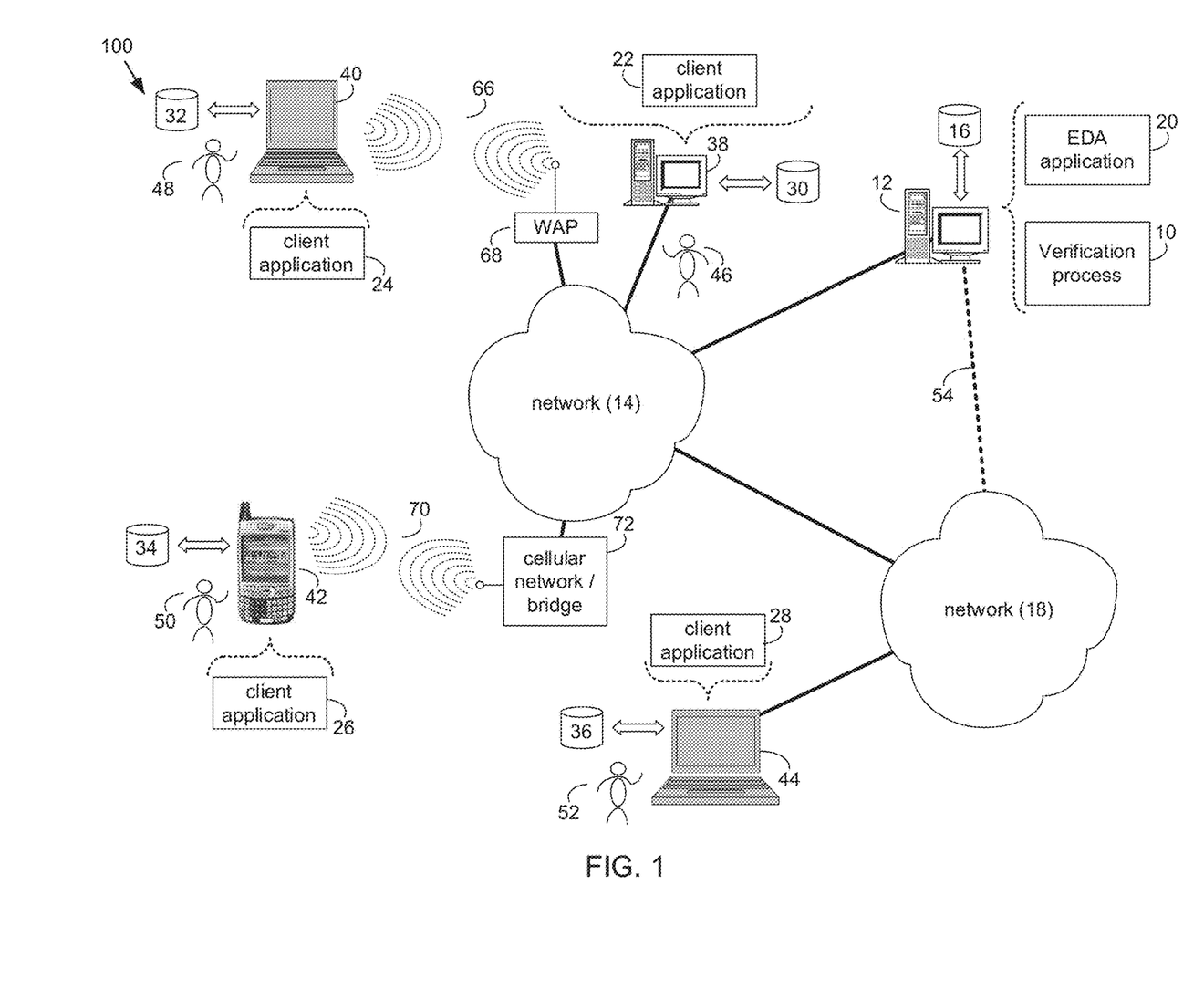
FIG. 1 is a diagram depicting an embodiment of a system in accordance with the present disclosure.

Referring to FIG. 1, there is shown a verification process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, verification process 10 may reside on and be executed, in whole or in part, by a client electronic device, such as a personal computer, notebook computer, personal digital assistant, or the like.

The instruction sets and subroutines of verification process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization and/or verification.

Verification process 10 may be a stand-alone application, or may be an applet/application/script that may interact with and/or be executed within EDA application 20. In addition/as an alternative to being a server-side process, verification process 10 may be a client-side process (not shown) that may reside on a client electronic device (described below) and may interact with an EDA client application (e.g., one or more of EDA client applications 22, 24, 26, 28). Further, verification process 10 may be a hybrid server-side/client-side process that may interact with EDA application 20 and an EDA client application (e.g., one or more of client applications 22, 24, 26, 28). As such, verification process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize verification process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
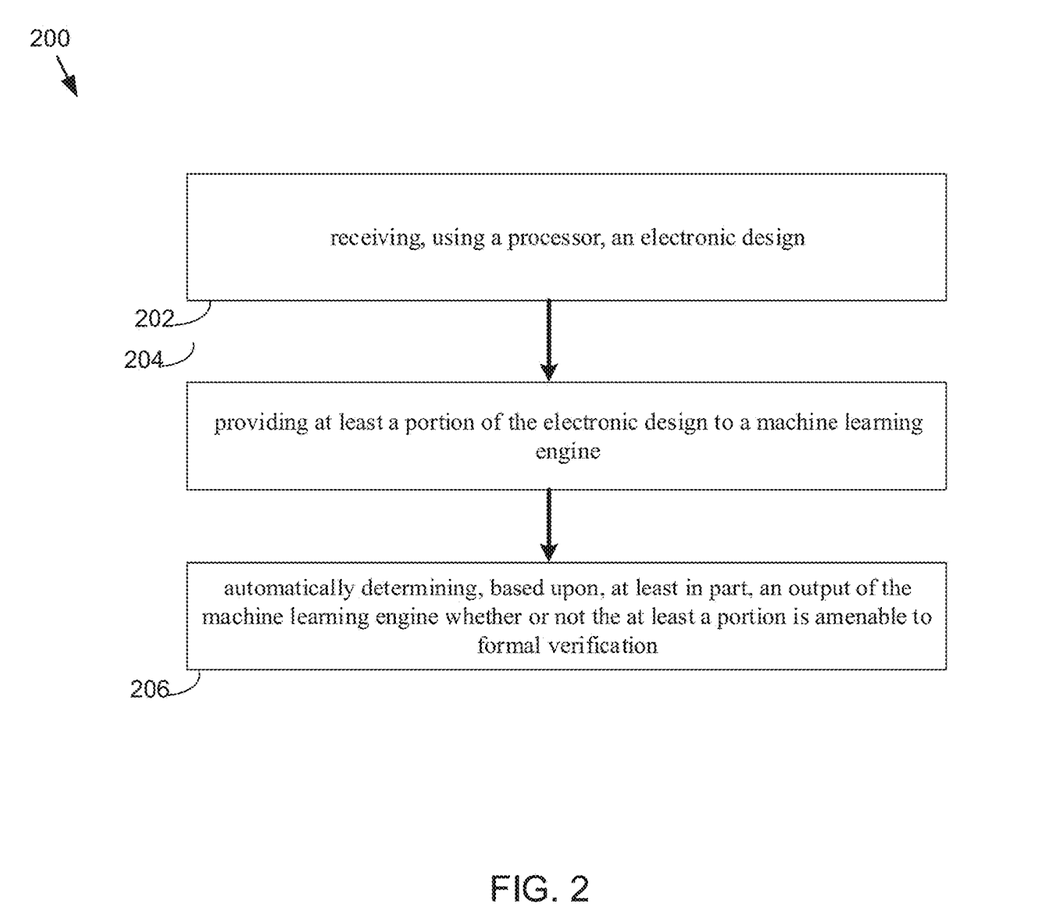
FIG. 2 is a flowchart depicting operations consistent with the verification process in accordance with an embodiment of the present disclosure.

Referring now to FIG. 2, an exemplary flowchart 200 depicting operations consistent with verification process 10 is provided. Operations may include receiving (202), using a processor, an electronic design and providing (204) at least a portion of the electronic design to a machine learning engine. The method may further include automatically determining (206), based upon, at least in part, an output of the machine learning engine whether or not the portion is amenable to formal verification. In some embodiments, operations may include using a software application which takes an electronic design as input and provides at least a portion of the design to a machine learning engine as is discussed in further detail below.

As discussed above, and referring also to FIG. 3, currently, engineers evaluate electronic designs using different criteria to determine if it is amenable to formal verification. These criteria are often provided as a diagram wherein each aspect of the design is graded. The grades from the different aspects are assessed together to determine if the design is formal amenable or not. Using this diagram, all grading and assessment is subjective, thus the current implementation works more as a mindset framework than as an actual tool. As such, the classification of the design as amenable or not depends on the experience of the formal verification engineer and their interpretation of the criteria. This subjective approach often leads to misclassification, which is always a problem. If a design is classified as amenable to formal but in reality is not, the engineer will waste time building the formal environment only to find out it can't be used to verify with confidence. This can lead to break of trust in the formal tool. On the other hand if the design is classified as not amenable to formal when it is, it leads to a lost opportunity to apply formal verification.

Figure 3:
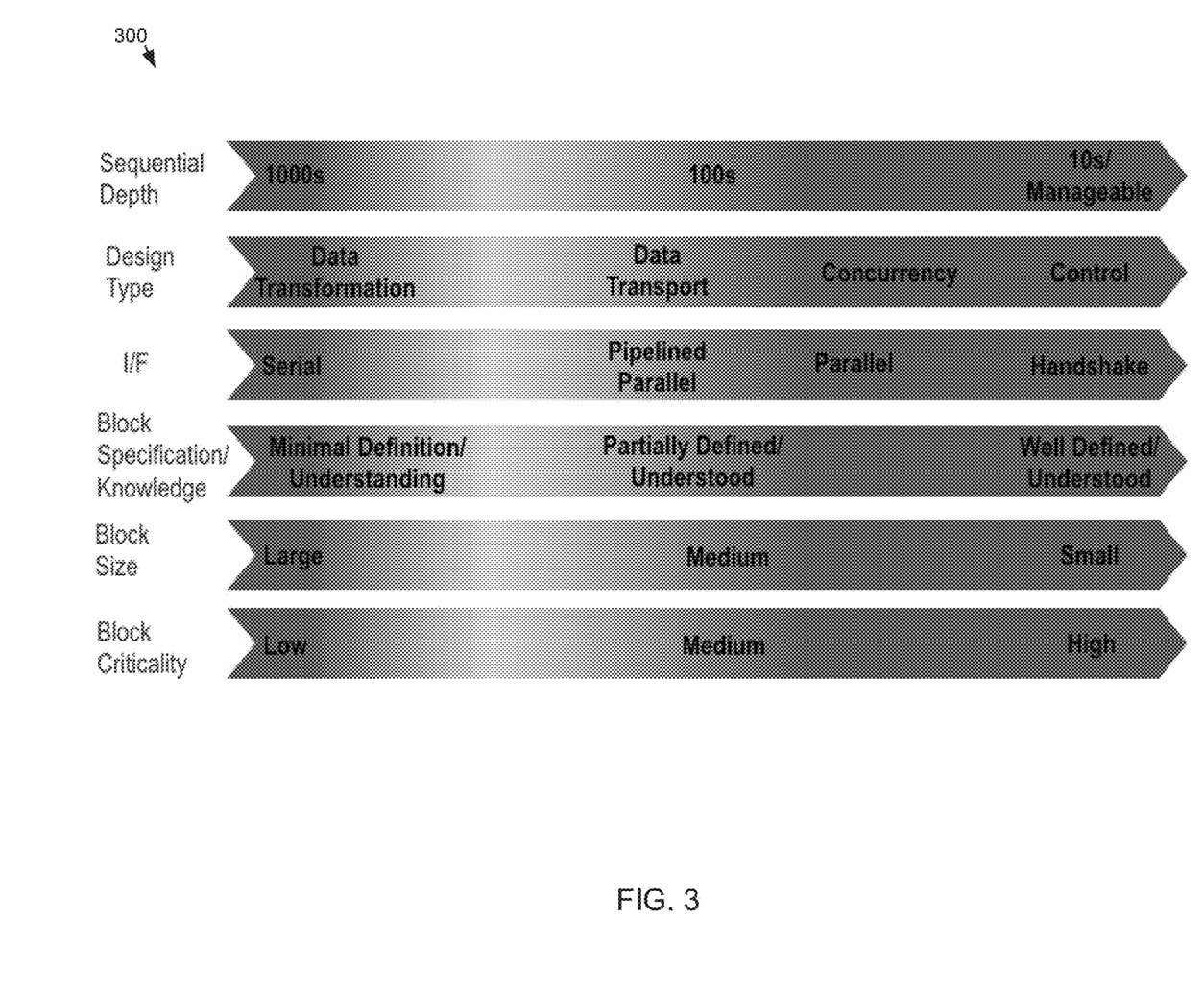
FIG. 3 is a diagram depicting an example showing the progression of whether an electronic design is amenable to formal verification.

The cause of the problem is the subjectivity of the current criteria grading and overall assessment. The criteria (e.g. "sequential depth") is provided with grades such as "1000s", "100s", "10s" (the higher the number the less likely formal verification is suggested). The user chooses a grade based on their assessment of the specification. Various other criteria may also be used. Some of these may include, but are not limited to, "Design type" with the grades "Data transformation", "Data transport", "Concurrency", "Control" (from left to right there is a progressive increase in whether or not formal verification should be suggested). Again, the user selects a grade. By looking at the overall state of the grades the user decides if the design is formal amenable or not. This process is very subjective.

Customers know that, when applied properly, formal verification achieves the outcome faster and with better confidence than simulation-based verification. However, not all kinds of designs are amenable to formal verification. Some of the influencing factors are sequential depth, design type, interface type, maturity of specification, size and criticality.

Accordingly, embodiments of verification process 10 may be configured to provide an automated way to determine formal amenability for a given design when creating the verification plan. Prior approaches resulted in verification engineers wasting time to determine whether formal verification was the ideal verification approach, since properties were not converging. Embodiments included herein describe an automated process to classify a design as amenable to formal or not when creating the verification plan for a design.

Figure 4:
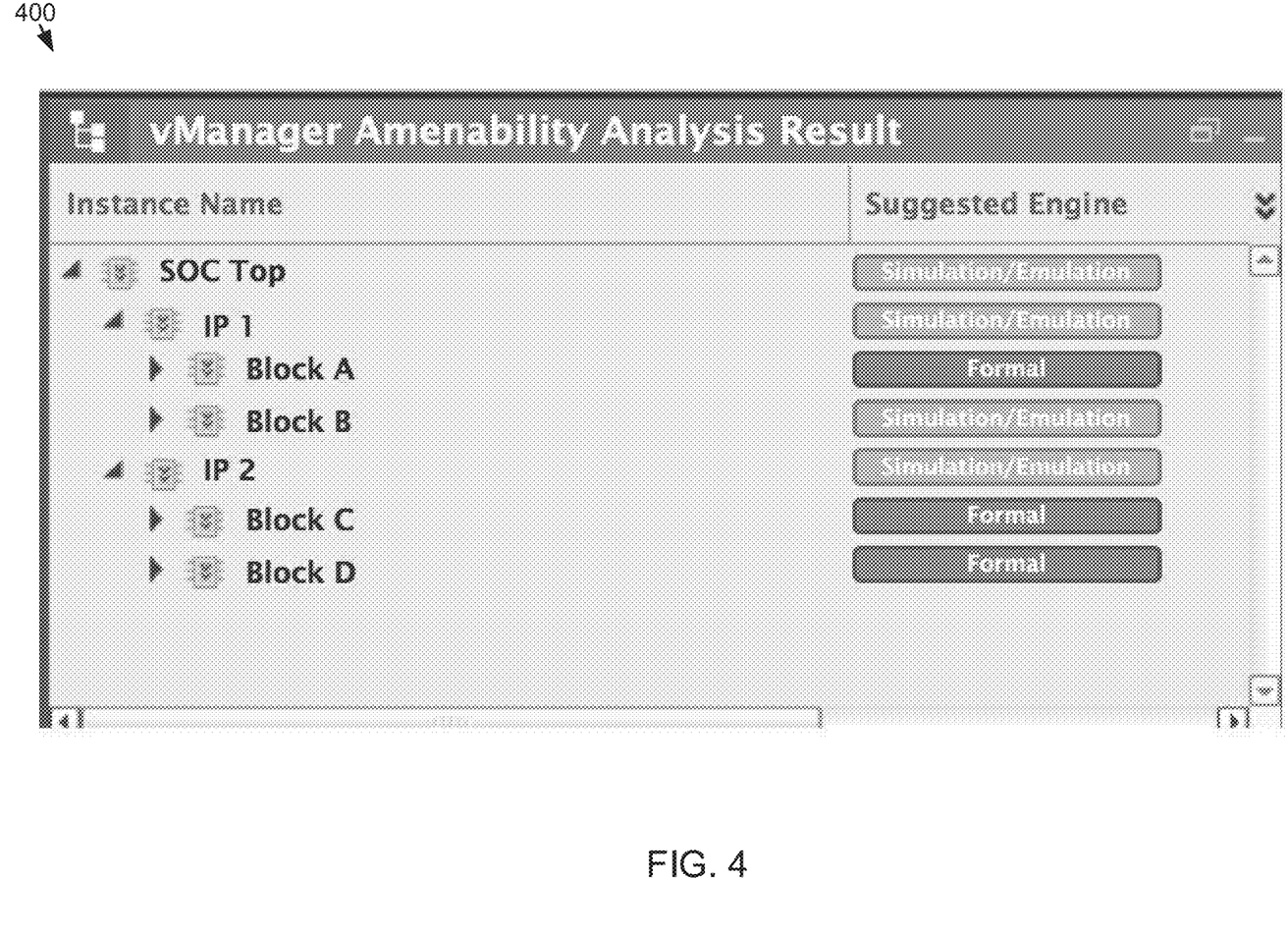
FIG. 4 is a graphical user interface in accordance with the present disclosure.

Referring now to FIG. 4, an example of a graphical user interface 400 consistent with embodiments of the present disclosure is provided. GUI 400 provides a display that shows the user various instance names and generates a suggested engine for each instance. For example, simulation/emulation or formal verification. In this particular example, for "Block A", "Block C", and "Block D" formal verification is suggested. Accordingly, embodiments of the present disclosure may help the customer to make an informed decision from the start by avoiding all the negative outcomes and benefitting from the right tool to deliver the best results efficiently. In this way, verification process 10 may automatically analyze the design and let the customer know which tool is best suited for the functional verification. This analysis may be performed at many different design scopes (e.g., IP level, cluster, subsystem, system-on-a-chip ("SoC"), etc.).

Figure 5:
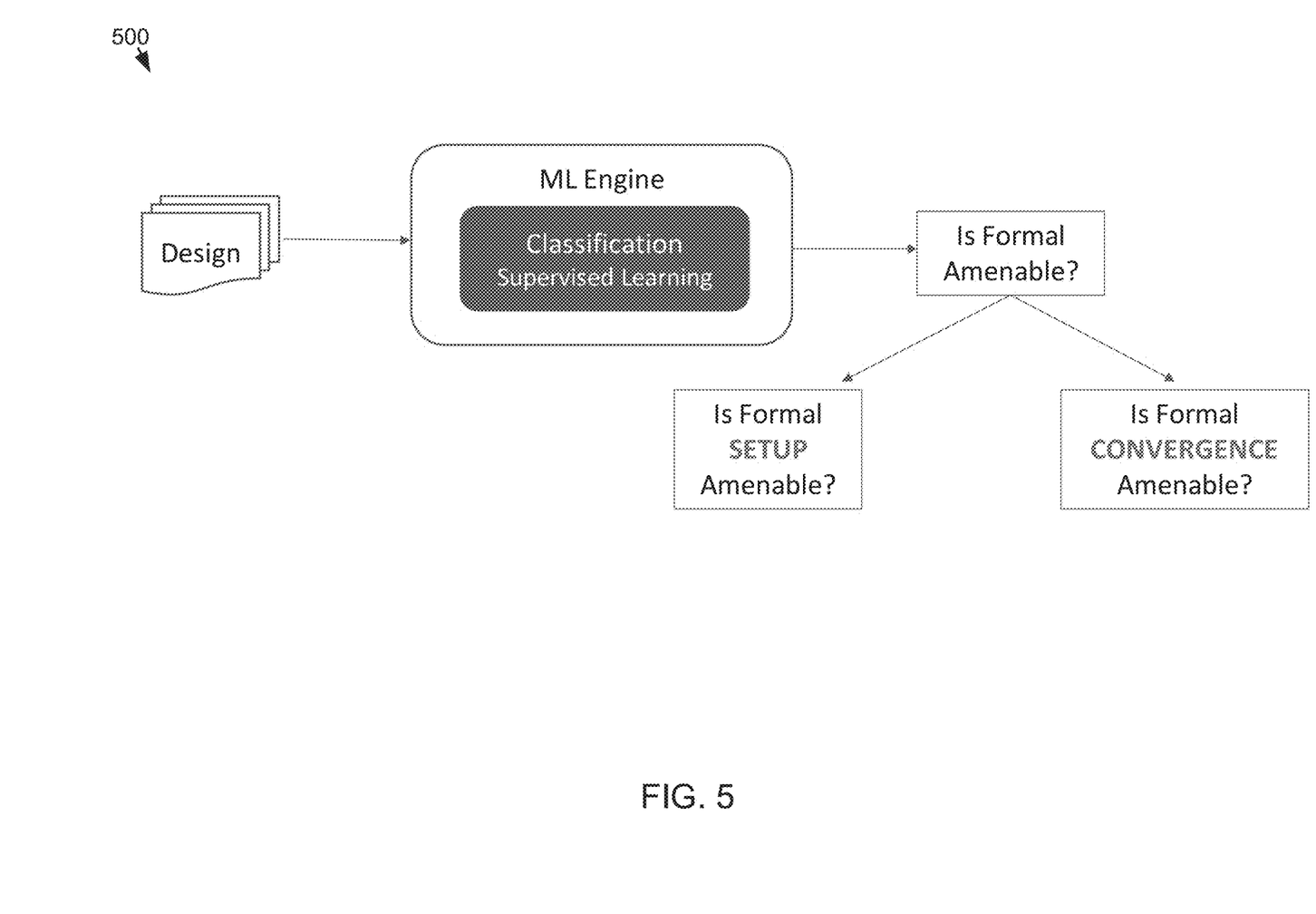
FIG. 5 is a diagram depicting an embodiment in accordance with the present disclosure.

Referring now to FIG. 5, a diagram 500 consistent with embodiments of verification process is provided. In some embodiments, determining whether a design/block is formal amenable or not may be based on a number of questions. Namely, whether or not the electronic design has a setup and a convergence that is amenable for formal verification.

In some embodiments, the setup of a formal environment may measure how much effort is needed to setup formal environment. This may include, but is not limited to, a consideration of not only the number of configurations (e.g., assumptions) needed, but also the complexity of configurations (e.g., assumptions flop cone of influence ("COI") bits, assumptions flop COI number, etc.). Accordingly, assumptions may be created manually and individually. Setting up a huge amount, or complex expressions, may be time consuming and may require user setup iterations.

In some embodiments, the convergence of some basic properties may measure how much effort is needed to have the formal functional properties converge, or at least be proven to a sufficient depth. This may be based upon, at least in part, a consideration of not only design structures, size and complexity, but also design controllability like effort to toggle outputs. For example, in a design without a formal setup, create toggle properties for all outputs and check its proof result, proof time to converge, minimal and maximum bounds, etc. Time and depth to toggle ports in a design without a formal setup can be used as an indication of complexity for functional formal properties.

In some embodiments, machine learning may refer to unsupervised or supervised learning. Unsupervised learning does not have labeled outputs, so its goal is to infer the natural structure present within a set of data points. For example, clustering, which is the most common use of unsupervised learning algorithms, may attempt to correlate and group the input information; and each group is considered to be one result. In supervised learning the system may have prior knowledge of what the output values for the samples should be. Therefore, the goal of supervised learning is to learn a function that, given a sample of data and desired outputs, best approximates the relationship between input and output observable in the data. This may be used to later predict the most probable output to an input you give to the trained algorithm of supervised learning.

In some embodiments, within supervised learning, there may be further divisions, namely, classification and regression. The majority of practical machine learning uses supervised learning. Supervised learning may refer to a situation where there are input variables (x) and an output variables (y) and an algorithm may be used to learn the mapping function from the input to the output (e.g., Y=f(X)). The goal is to approximate the mapping function so well that when new input data (x) is present that the output variables (Y) for that data may be predicted. This is referred to as supervised learning because the process of an algorithm learning from the training dataset can be thought of as a teacher supervising the learning process. The system may know the correct answers and the algorithm may iteratively make predictions on the training data and may be corrected by the teacher. Learning stops when the algorithm achieves an acceptable level of performance.

In some embodiments, supervised learning problems may be further grouped into regression and classification problems. A classification problem may refer to a situation where the output variable is a category, such as "red" or "blue" or "disease" and "no disease". A regression problem may refer to a situation where the output variable is a real value, such as "dollars" or "weight". Accordingly, embodiments included herein may be configured to decide if a new design is formal amenable or not by analyzing how difficult it is to setup a design for formal verification and how difficult it is to get convergence of formal design properties. In some embodiments, the definition of how difficult it is to setup a design may be based on a number of items, e.g., those described below, and may be captured from designs already setup for formal to train the ML engine.

Figure 6:
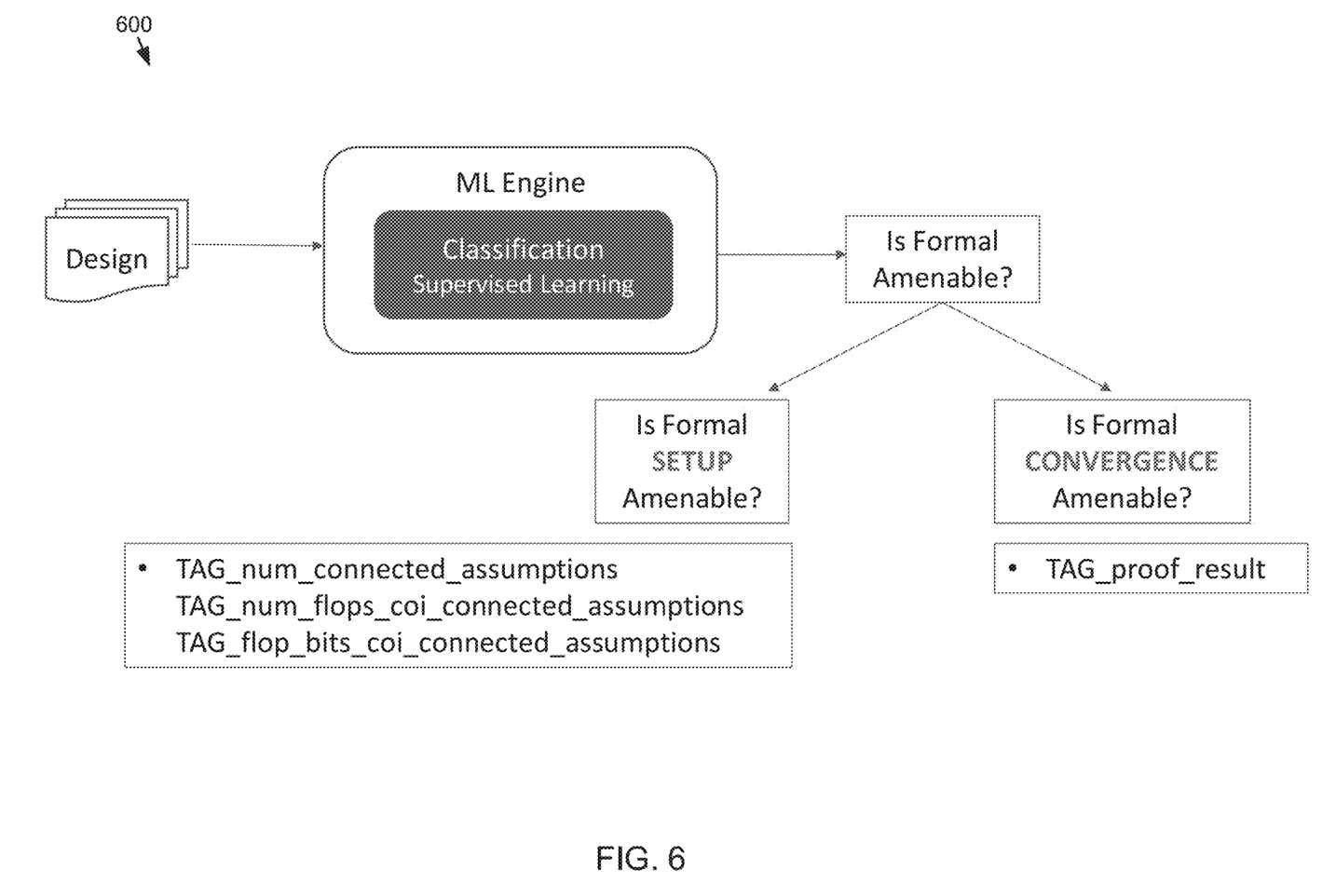
FIG. 6 is a diagram depicting an embodiment in accordance with the present disclosure.

Referring now to FIG. 6, a diagram 600 consistent with embodiments of verification process is provided. In some embodiments, and as discussed above, in order to identify a design as formal amenable or not for training machine learning, multiple analyses may be performed. First, for setup amenability, designs and/or properties (e.g., connected assumptions) may be analyzed regarding amount and complexity. Additionally and/or alternatively, for convergence amenability, the proof time of one or more properties may be analyzed. With these analyses, embodiments included herein may generate a formula to identify the amenability of a design or portion of a design automatically. Once a label or tag is decided for a training data set, features may then be collected and added to machine learning training set as shown in FIG. 6.

In this particular example, the term "TAG_num_connected_assumptions" may refer to the number of connected assumptions required to setup the formal environment and may vary according to design complexity and verification targets. A long list of assumptions is time intensive since such setup assumptions are usually created manually and may require many setup iterations. Alternatively, "TAG_num_flops_coi_connected_assumptions" may refer to the number of flops in COI of connected assumptions, which may provide an idea of how much logic needs to be controlled by formal setup assumptions. For each assumption, a reasoning may be required and, as such, more complex reasoning may be required if more logic is involved. The term "TAG_flop_bits_coi_connected_assumptions" may refer to the number of flops bits in COI of connected assumptions, which may provide an idea about the size of the logic controlled by formal setup assumptions. The more bits it controls, more complex data structures need to be configured, so more complex reasoning may be required.

In some embodiments, the definition of how difficult it is to obtain convergence for a design may be based on the proof result and may be captured from designs already setup for formal to train ML engine. The term "TAG_proof_result" may indicate whether formal proof convergence has been reached or not. In order to train the ML engine, designs already setup for formal may be used to generate useful information. The COI of each functional property in a design may be seen as a separate specific-design, thus it is easy to identify their connected assumptions (e.g., TAG_num_connected_assumptions, TAG_num_flops_coi_connected_assumptions, TAG_flop_bits_coi_connected_assumptions) and proof result (TAG_proof_result–load design in a formal tool, prove functional properties and capture connected assumption a metrics/features for each functional property). The training set may be classified with such TAG values or a combination of them. In some embodiments, TAG values may constitute the targets to be inferred by the ML engine for a new design. Inferred TAG may provide the means to determine if a new design is formal amenable of not, depending on the weight the user may give to each of such TAGs. This may vary according to user objectives, for example, obtain the decision based on setup, convergence or both.

Figure 7:
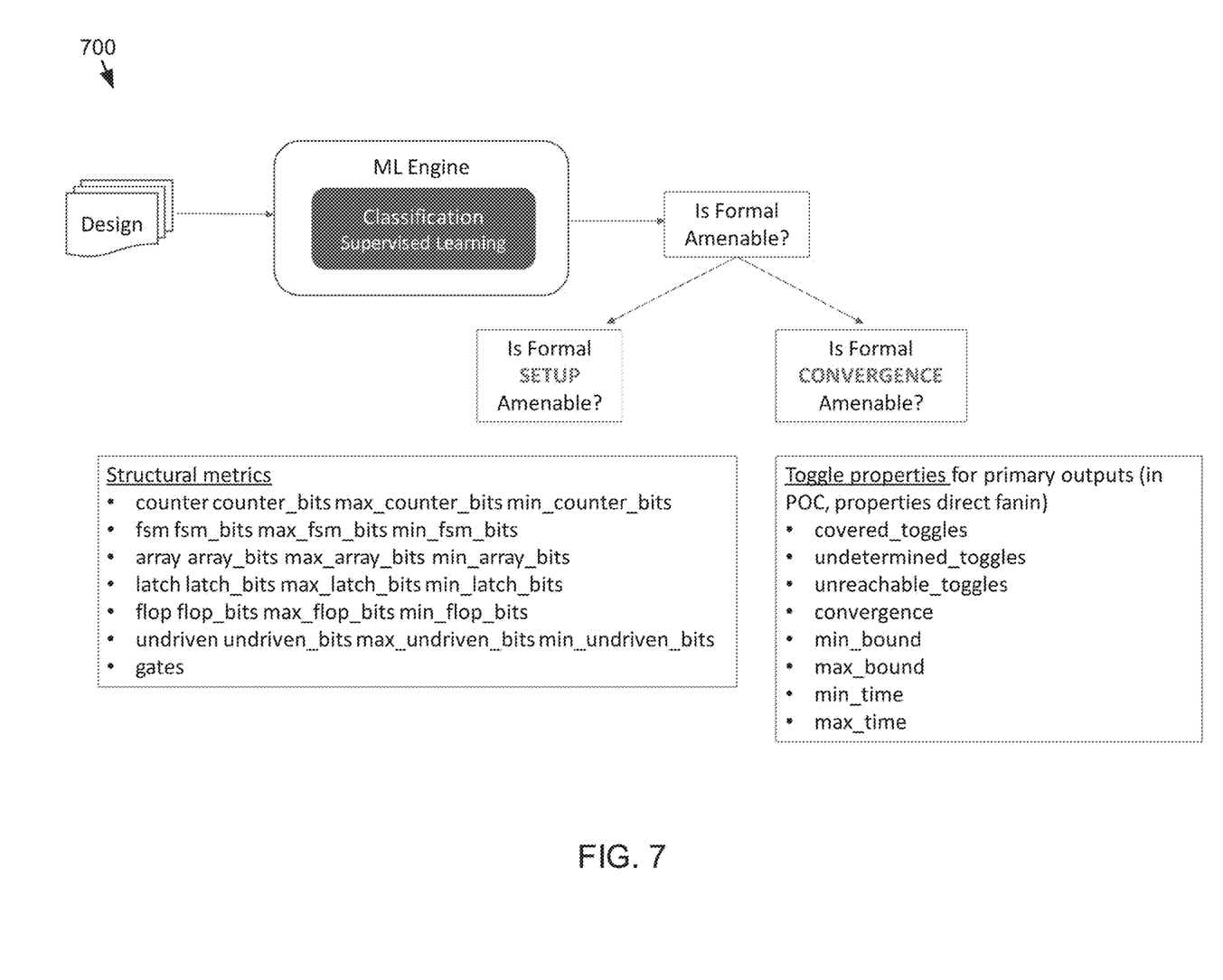
FIG. 7 is a diagram depicting an embodiment in accordance with the present disclosure.

Referring now to FIG. 7, a diagram 700 consistent with embodiments of verification process is provided. In some embodiments, once a tag is computed for a training data set, features may need to be collected and added to the machine learning training set. It should be noted that features may be collected without considering any formal setup environment. In some embodiments, design features may be based on structural and observability analysis, but may be expanded to consider complex features like coverage information.

A non-exhaustive list of features that may be used in accordance with embodiments of the present disclosure are provided below:

counter: How many memory elements exist in the design to track numbers. Counters are directly related to tracking scenarios with multiple cycles, which indicate high complexity.

counter_bits: Size of the counters, in bits.

max_counter_bits: Maximum size among all counters.

min_counter_bits: Minimum size among all counters.

fsm fsm_bits: How many memory elements exist in the design to track the state of FSMs (finite state machine). Similar to counters, FSM presence indicates interactions that span over multiple cycles, and thus can be associated with design complexity.

max_fsm_bits: Maximum size of state variable among all FSMs.

min_fsm_bits: Minimum size of state variable among all FSMs.

array array_bits: Total number of bits among design arrays (vectors).

max_array_bits: Size of largest array in the design.

min_array_bits: Size of smallest array in the design.

latch latch_bits: How many memory elements in the design of the type latch exist.

max_latch_bits: Size of largest latch in the design.

min_latch_bits: Size of smallest latch in the design.

flop: How many memory elements in the design of the type flop exist.

flop_bits: Total number of bits in all flops.

max_flop_bits: Maximum size, in bits, among all flops.

min_flop_bits: Minimum size, in bits, among all flops.

undriven: How many signals in the design do not have a driving logic.

undriven_bits: How many bits in total among undriven signals.

max_undriven_bits: Maximum size, in bits, among undriven signals.

min_undriven_bits: Minimum size, in bits, among undriven signals.

gates: Name of logic structures in the design (ANDs, ORs, NOTs, etc).

toggle: A property that evaluates if a signal can transition from 0 to 1 or from 1 to 0.

covered_toggles: How many toggle properties have been determined covered, which means, have a trace that show them being exercised from the reset state.

undetermined_toggles: How many toggle properties do not have a result within the effort spent.

unreachable_toggles: How many toggle properties are determined to be impossible to reach.

convergence: Characteristic associated with the ability to determine the properties of the design.

bound: The number of cycles required to show a property being covered from reset.

min_bound: Lowest bound among covered properties.

max_bound: Highest bound among covered properties.

min_time: Time elapsed to determine the property that was determined first.

max_time: Time lapsed to determine the property that was determined last.

Figure 8:
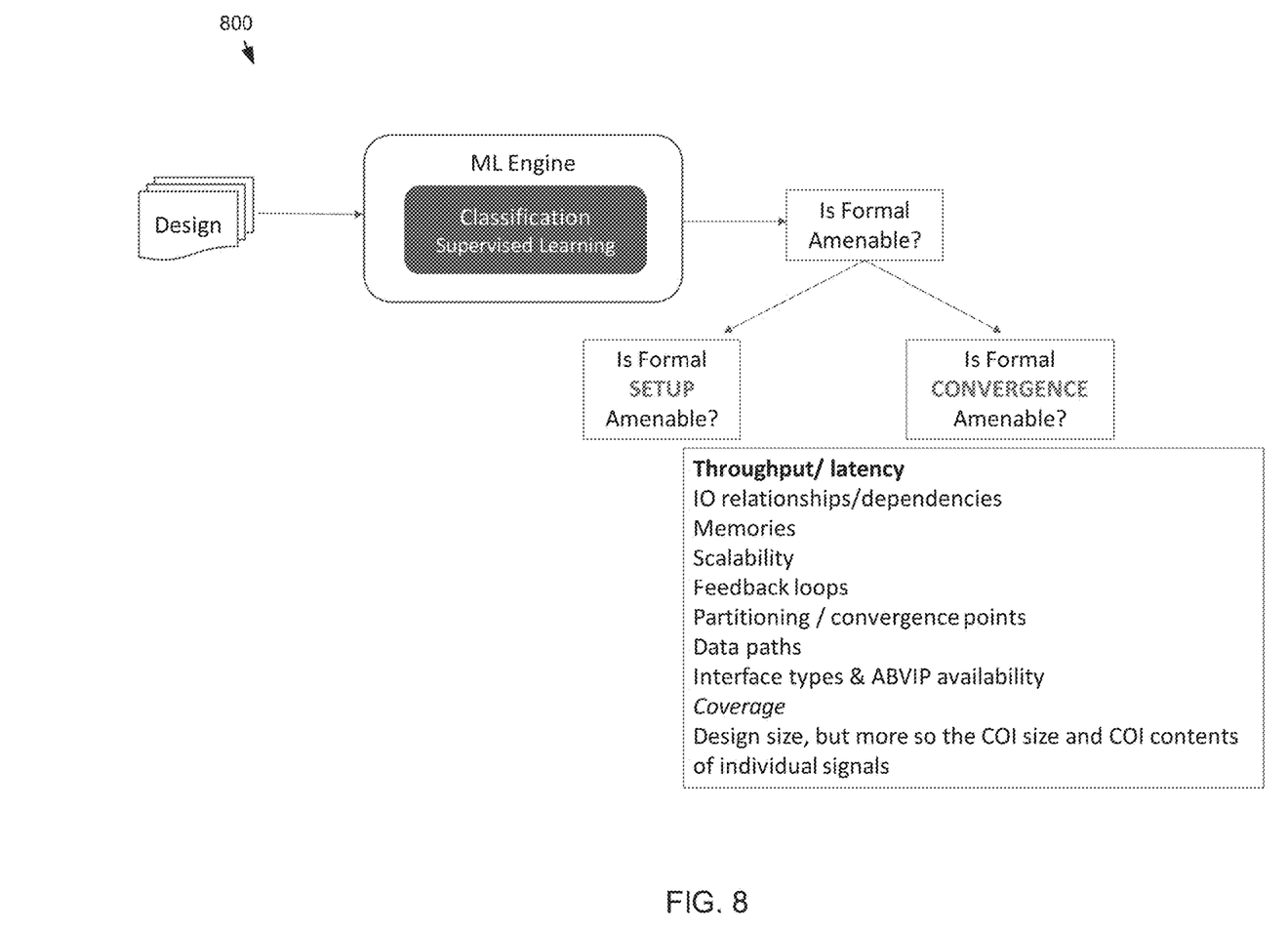
FIG. 8 is a diagram depicting an embodiment in accordance with the present disclosure.

Referring now to FIG. 8, a diagram 800 consistent with embodiments of verification process is provided. In some embodiments, the process may be configured to analyze throughput/latency, which may provide an indication of overall sequential depth. For example, the number of cycles required for an input to have an effect at the outputs. Accordingly, running this analysis from different design states may provide a different picture. For example, immediately after reset would typically result in the lowest latency. However, once control paths are understood, the output flow may be blocked while still pushing data into the design, which may allow queues and buffers to fill up. This may provide a measure of capacity, but if the latency is also measured once the design is full then a more pessimistic latency measurement can be taken.

In some embodiments, the process may also analyze I/O relationships and/or dependencies. An example may include write data entering the system that needs to be accompanied by a valid signal. By running tests with various inputs tied high/low such dependencies should become apparent. Once the dependencies are known, the relationships may be used to perform more precise measurements as above.

In some embodiments, the process may also analyze various memories. These are generally bad for formal verification, but they can often be abstracted or remodeled. For example, if a designer initially reviews a raw design and locates memories, however, in the final run environment the designer identifies that the memories are either not present or have been remodeled then it may indicate that there are other data points that indicate why this memory was able to be handled.

In some embodiments, the process may also analyze scalability. A common approach to overcome complexity is to scale the design down to something much smaller. For example, data busses, under certain conditions can be considered as an atomic variable, as such, a data bus width could be reduced to a single bit for the purpose of formal analysis. Similar reasoning may be applied to queue/fifo/buffer depths. For example, they might be reduced in size to four for purposes of formal analysis. Scalability may be controlled by one or more parameters or compiler directives, e.g., DATA_WIDTH, 'FIFO_DEPTH etc. A common problem is that designers do not always use the parameter in expressions that relate to these settings. They might use them in the top level ports, but in the low level logic they typically have a particular setting in mind and use that hard-coded number when they should really have an expression in terms of the parameter. The result is that some parameter settings may work while others may not—if designers are lucky they will see elaboration errors, but more subtle issues can slip through and only show as assertion failures, worst still issues may result in a proven result. Knowing that a design is scalable and scales correctly can make the difference between being good and bad for formal.

In some embodiments, the process may also analyze feedback loops. Feedback loops in a design may represent sequential complexity. If the design can be broken into stages that break the loops then they are much easier to verify. Being able to detect feedback loops and be able to partition the design may help as discussed in further detail below.

In some embodiments, the process may also analyze partitioning and/or convergence points. If design functionality is clearly separated by explicit module instances, then each module may be verified independently and potentially abstracted when proving the top level. If the design has no instances then any opportunities for partitioning are made much harder as users need to identify specific signals in various logic expressions to isolate. Understanding the design flow in terms of data and control paths should give an indication of where to partition. For example, any kind of buffer/memory/fifo may serve as a natural convergence point where a partition could be applied. Behavior up to and from the convergence point may be verified separately so long as the interface (e.g., a fifo) is also verified independently.

In some embodiments, the process may also analyze data paths. Accordingly, being able to identify data vs control paths allows the type of data path to be determined. Some data paths may be encoded and sequential in nature (e.g.

video compression data). These may be worse for formal than data that has no/little relationship to its neighbouring cells.

In some embodiments, the process may also analyze interface types and Assertion-Based Verification Intellectual Property ("ABVIP") availability. Packet based, or serial protocols where control logic is encoded in the data stream are much worse for formal than control-agnostic data and, as such, being able to detect the difference may help to profile a design. If specific known protocols (e.g., Advanced eXtensible Interface "AXI"/Advanced High-performance Bus "AHB", etc.) can be detected then these score much higher as we already have ABVIPs for these, otherwise the user may need to invest in developing properties for the protocol—a process that can take a lot of time and resource. AXI and AHB are examples of interface protocols provided by ARM's Advanced Microcontroller Bus Architecture ("AMBA") open-standard, which may define on-chip interconnect communication.

In some embodiments, the process may also analyze coverage. For example, running branch/expression/toggle coverage from reset but without constraints may expose complexity areas. Without constraints it should be possible to hit most cover items relatively easily, but some may still take many cycles. Code related to unreached coverage or even the deepest cover items that were reached should be analyzed further to understand who it impacts the overall design.

Figure 9:
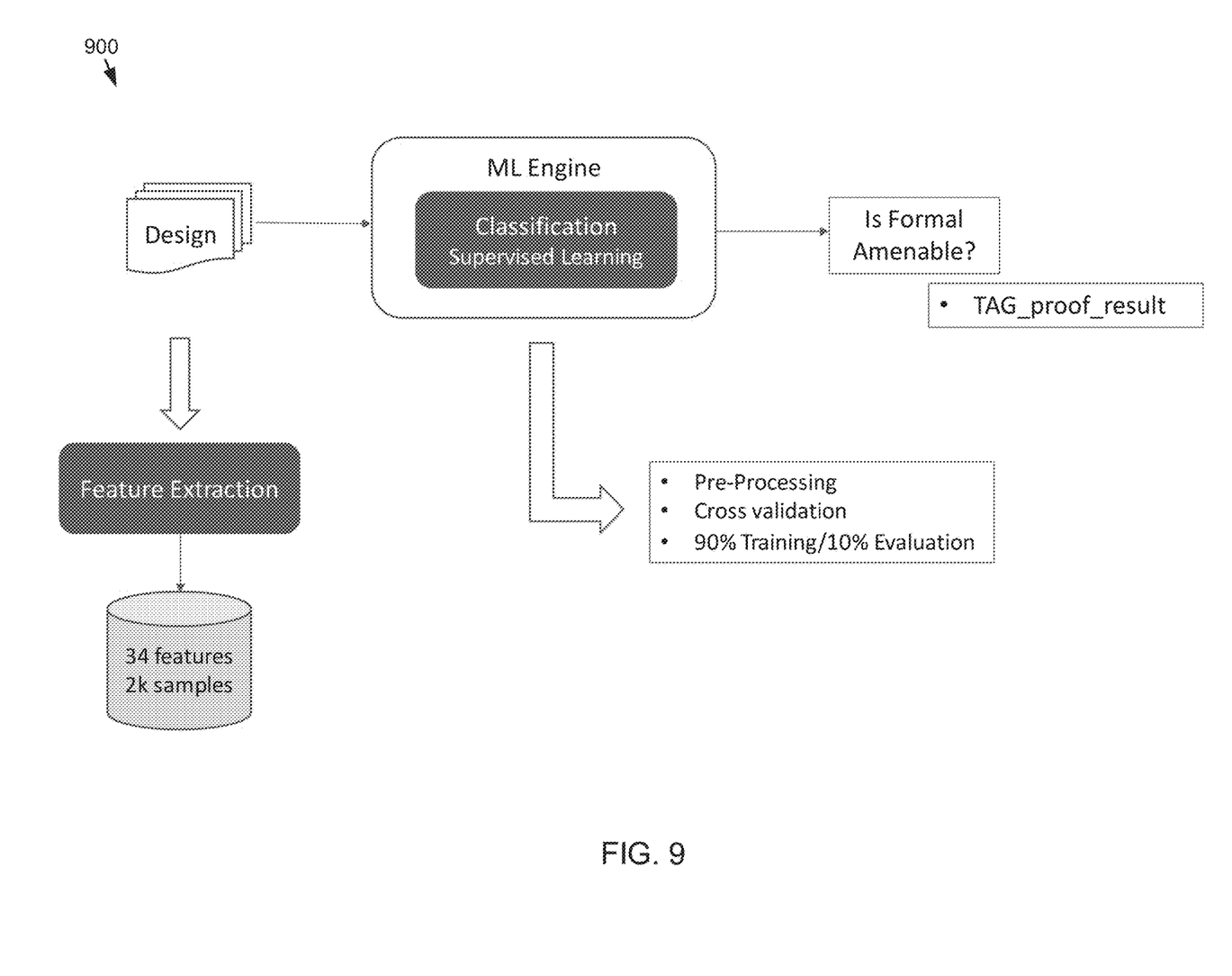
FIG. 9 is a diagram depicting an embodiment in accordance with the present disclosure.
Figure 10:
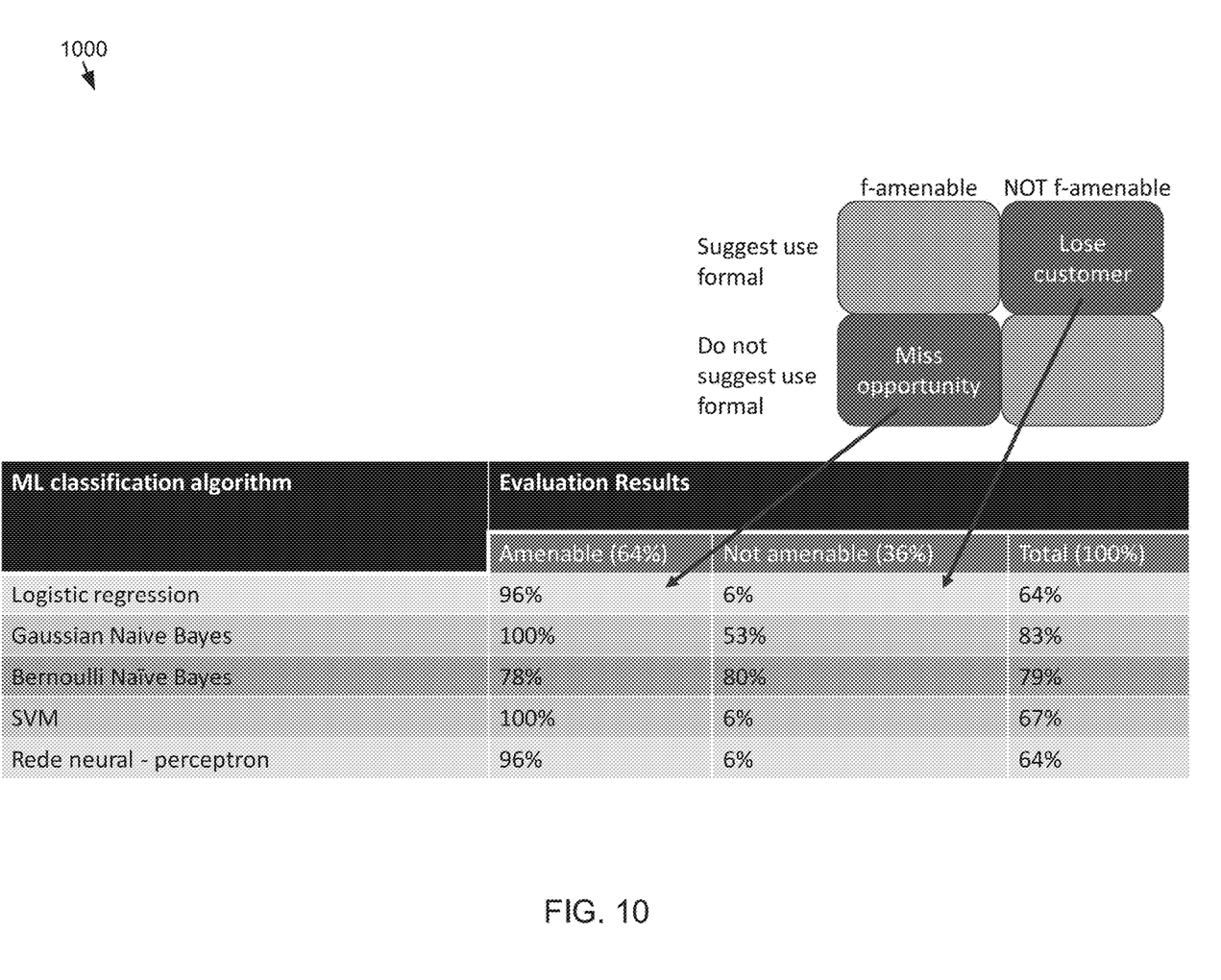
FIG. 10 a diagram showing results in accordance with the present disclosure.

Referring now to FIG. 9, a diagram 900 consistent with embodiments of verification process is provided. In some embodiments, any number of features may be extracted (e.g. in the example shown in FIG. 9, 34 features were extracted). In some embodiments, the machine learning engine may include a pre-processing step, cross-validation and evaluation of some classification algorithms. Any suitable classification algorithm may be used without departing from the scope of the present disclosure. A logistic regression approach may use a logistic function (e.g., a sigmoid curve) to model the relationship between a binary dependent variable and one or more independent ones. This isn't a classification method per se, as it yields a probability value. However a classifier is easily derived from it by choosing a threshold for the probabilities. A Naive Bayes method may involve a set of supervised learning algorithms based on applying Bayes' theorem with the "naive" assumption of conditional independence between every pair of features given the value of the class variable. The difference between the various Naïve Bayes methods resides in the choice of how the feature is assumed to be statistically distributed. Some types may include a Gaussian Naïve Bayes Classifier that considers the data to be statistically distributed like the Gaussian distribution or a Bernoulli Naïve Bayes Classifier for discrete data designed for binary/boolean features. A Support Vector Machine ("SVM") is a set of supervised learning methods used for classification, regression and outliers detection. In this algorithm, the process involves plotting each data item as a point in n-dimensional space (where n is number of features you have) with the value of each feature being the value of a particular coordinate. Then, the system may perform classification by finding the hyperplane that differentiates the two classes very well. Support Vectors are simply the coordinates of individual observation. Support Vector Machine is a frontier which best segregates the two classes (hyper-plane/line). In Hyper-plane, if you have one feature, your problem can be plotted on a line, two features can be plotted on a plane, with more than two features you can talk about a hyperplane. A neural network approach provides a framework for many different machine learning algorithms to work together and process complex data inputs. An ANN may be based on a collection of connected units or nodes called artificial neurons, which loosely model the neurons in a biological brain. Each connection, like the synapses in a biological brain, can transmit a signal from one artificial neuron to another. An artificial neuron that receives a signal can process it and then signal additional artificial neurons connected to it. A Perceptron algorithm may be used for supervised learning of binary classifiers. A binary classifier is a function which can decide whether or not an input, represented by a vector of numbers, belongs to some specific class. In the example of FIG. 10, the best classification algorithm was Bernoulli Naïve Bayes, which provided 78% of matching for amenable designs and 80% for not amenable designs.

In some embodiments, verification process 10 may be automated and integrated into an EDA tool such as verification planner with easy access to information, and without requiring knowledge about formal verification. Additionally, this is a deterministic method and is not based on a subjective process.

Embodiments included herein provide advantages over existing solutions as it is less prone to error and does not require judgement from the user (thus result doesn't change depending on the user). It is more accurate and easier to apply, since it's automated. Can be integrated to early stages of verification planner of a design, preventing verification engineer to waste time on building formal environment when design is not formal amenable. This will accelerate the formal verification process.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for electronic design verification comprising:

receiving, using a processor, an electronic design;

providing at least a portion of the electronic design to a machine learning engine, wherein the machine learning engine utilizes a Bernoulli Naïve Bayes classification algorithm; and automatically determining, based upon, at least in part, an output of the machine learning engine, whether or not the at least a portion is amenable to formal verification, wherein automatically determining includes analyzing a level of analysis required for convergence of one or more formal properties associated with the electronic design and wherein analyzing the level of analysis required includes analyzing design structures, design size, design complexity, and design controllability.

2. The computer-implemented method of claim 1, wherein determining includes analyzing a number of configurations and a complexity of configurations.

3. The computer-implemented method of claim 1, wherein analyzing a level of analysis required includes determining a proof time required for convergence of the one or more formal properties.

4. The computer-implemented method of claim 1, further comprising:

labeling the at least one portion as being amenable to formal verification.

5. The computer-implemented method of claim 4, further comprising:
   collecting one or more design features from the at least one portion.

6. The computer-implemented method of claim 5, further comprising:
   adding the one or more design features to the machine learning engine.

7. The computer-implemented method of claim 5, wherein the one or more design features are collected using structural and observability analysis.

8. A computer-readable storage medium for electronic design verification, the computer-readable storage medium having stored thereon instructions that when executed by a machine result in one or more operations, the operations comprising:
   receiving, using a processor, an electronic design;
   providing at least a portion of the electronic design to a machine learning engine, wherein the machine learning engine utilizes a Bernoulli Naïve Bayes classification algorithm; and
   automatically determining, based upon, at least in part, an output of the machine learning engine, whether or not the at least a portion is amenable to formal verification, wherein automatically determining includes analyzing a level of analysis required for convergence of one or more formal properties associated with the electronic design and wherein analyzing the level of analysis required includes analyzing design structures, design size, design complexity, and design controllability.

9. The computer-readable storage medium of claim 8, wherein determining includes analyzing a number of configurations and a complexity of configurations.

10. The computer-readable storage medium of claim 8, wherein analyzing a level of analysis required includes determining a proof time required for convergence of the one or more formal properties.

11. The computer-readable storage medium of claim 8, further comprising:
   labeling the at least one portion as being amenable to formal verification.

12. The computer-readable storage medium of claim 8, further comprising:
   collecting one or more design features from the at least one portion.

13. The computer-readable storage medium of claim 12, further comprising:
   adding the one or more design features to the machine learning engine.

14. The computer-readable storage medium of claim 12, wherein the one or more design features are collected using structural and observability analysis.

15. A system for electronic design verification comprising:
   a computing device having at least one processor configured to receive an electronic design and to provide at least a portion of the electronic design to a machine learning engine, wherein the machine learning engine utilizes a Bernoulli Naïve Bayes classification algorithm, the at least one processor further configured to automatically determine, based upon, at least in part, an output of the machine learning engine, whether or not the at least a portion is amenable to formal verification, wherein determining includes analyzing a number of configurations, a complexity of configurations, and a level of analysis required for convergence of one or more formal properties associated with the electronic design.

\* \* \* \* \*